United States Patent [19]

Caputo et al.

[11] Patent Number: 4,895,108

[45] Date of Patent: Jan. 23, 1990

[54] CVD APPARATUS AND PROCESS FOR THE PREPARATION OF FIBER-REINFORCED CERAMIC COMPOSITES

[75] Inventors: Anthony J. Caputo; Charles E. Devore, both of Knoxville; Richard A. Lowden, Powell, all of Tenn.; Helen H. Moeller, Concord, Va.

[73] Assignee: The Babcock & Wilcox Company, New Orleans, La.

[21] Appl. No.: 209,830

[22] Filed: Jun. 22, 1988

[51] Int. Cl.$^4$ .............................................. C23C 16/30
[52] U.S. Cl. ...................................... 118/728; 118/724; 118/725; 264/81; 427/255.2
[58] Field of Search ....................... 118/724, 725, 728; 427/248.1, 255, 255.2; 264/81, 82, 257, 261, 271.1, 271.9, DIG. 36

[56] References Cited

U.S. PATENT DOCUMENTS

| | | | |
|---|---|---|---|
| 3,673,051 | 6/1972 | Clark et al. | 264/81 |
| 4,275,095 | 6/1981 | Warren | 427/228 |
| 4,397,901 | 8/1983 | Warren | 428/101 |
| 4,580,524 | 4/1986 | Lackey, Jr. et al. | 118/725 |
| 4,766,013 | 8/1988 | Warren | 427/255.2 |

OTHER PUBLICATIONS

"Boron Nitride Chemical Vapor Infiltration of Fibrous Materials from $BCl_3$—$NH_3$—$H_2$ or $BF_3$—$NH_3$ Mixtures: A Thermodynamic and Experimental Approch," H. Hannache, R. Naslain, and C. Bernard in *Journal of Less-Common Metals*, 95, pp. 221–246, (1983).

"Laminate Optimization for Filamentary Composites," L. E. Hackman and C. L. Stotter in *Advanced Fibrous Reinforced Composites*, vol. 10, pp. C-1 thru C-11, a publication of Society of Aerospace Materials and Process Engineers, 10th National Symposium and Exhibit, Nov. 9-11, 1966.

"The Process Development and Mechanical Testing of a Carbon/Carbon Composite Fabricated by Chemical Vapor Infiltration of a Filament-Wound Substrate," by J. D. Theis, Jr., *Third International Conference on Chemical Vapor Deposition*, 1972, edited by F. A. Glaski, American Nuclear Society.

"CVD Boron Nitride Infiltration of Fibrous Structures: Properties of Low Temperature Deposits," by J. J. Gebhardt in *Fourth International Conference on Chemical Vapor Deposition*, 1973, edited by G. F. Wakefield and J. M. Blocher, Electrochemical Society.

C. F. Powell et al., *Vapor Deposition*, J. Wiley & Sons, Inc., 1966, pp. 374–375, 378–384, and 663–665.

Primary Examiner—Richard Bueker
Assistant Examiner—Terry J. Owens
Attorney, Agent, or Firm—Vytas R. Matas; Robert J. Edwards; Daniel S. Kalka

[57] ABSTRACT

An apparatus and process for the chemical vapor deposition of a matrix into a preform having circumferentially wound ceramic fibers, comprises heating one surface of the preform while cooling the other surface thereof. The resulting product may have fibers that are wound on radial planes or at an angle from the radial planes. The fibers can also be precoated with pyrolytic carbon before application of the matrix. The matrix is applied by passing reactant gas through the preform thereto the other side thereof for the initial deposition of matrix near such other surface of the preform. The matrix fills in the preform from the other side surface thereof to the surface of the side of application thereof until a desired amount of matrix has been deposited.

5 Claims, 3 Drawing Sheets

CVD APPARATUS AND PROCESS FOR THE PREPARATION OF FIBER-REINFORCED CERAMIC COMPOSITES

This invention was made with Government support under DE-AC05-840R21400 awarded by the Department of Energy to Martin Marietta Energy Systems, Incorporated which entered into contract No. CR-84-1 with the Assignee. The Government has certain rights in this invention.

FIELD AND BACKGROUND OF THE INVENTION

The present invention relates to a chemical vapor deposition process and apparatus, and to a product made with the process and apparatus which comprises a fiber preform structure which carries a ceramic matrix.

In recent years, ceramics have been the focus of considerable attention for use in advanced energy conversion systems such as heat exchangers, gas turbines and other heat engines. The low fracture toughness of conventional ceramic is a severe limitation to their use in a number of applications.

Considerable work has been carried out over the past twenty years in the development of fiber-reinforced ceramics in an attempt to improve ceramic toughness. It has become known that the toughness of some ceramics can be increased appreciably by reinforcement with high strength fibers. However, conventional ceramic fabrication procedures which generally involve pressing and heating at high temperatures, can lead to damage of reinforcing fibers and result in significant reduction in fiber strength. In order to overcome such problems, chemical vapor deposition (CVD) processes have been developed whereby fibrous forms are subjected to infiltration by reactant gaseous materials which, under controlled conditions, react to form a ceramic matrix on and around the fibers. Thereby, a fiber-toughened ceramic composite is provided without any damage to the fibers.

There are shortcomings in such chemical vapor deposition processes, however. Some of the chemical vapor deposition processes use a flow of gaseous material around a heated fibrous form and depend on diffusion to transport the reactant gases into the fibrous form.

U.S. Pat. No. 4,580,524 to Lackey, Jr., et al, which is incorporated here by reference, comprehensively discloses prior art which is relevant to the present application. This reference teaches of a chemical vapor deposition (CVD) process for preparing fiber-reinforced ceramic composites. It provides for a steep thermal gradient across the thickness of a fibrous preform. Even though it teaches of the preparation of a fiber-reinforced tubular composite, it has been found that a satisfactory tubular composite cannot be prepared. One of the primary problems appears to reside in obtaining the desired temperature of the inner surface of the fibrous preform. When the inner surface of the fibrous preform is not sufficiently cooled, deposition occurs at that surface preventing further flow of reactant gases into the preform.

U.S. Pat. Nos. 4,275,095 and 4,397,901 to Warren disclose a process for encasing fibers with a pyrolytic carbon coating while increasing the surface fracture energy of the composite structure. The composite structure results in a greater toughness and flaw resistance.

An article "The Process Development and Mechanical Testing of a Carbon/Carbon Composite Fabricated by Chemical Vapor Infiltration of a Filament—Wound Substrate" by J. D. Theis, Jr. presented at the 3rd International Conference on Chemical Vapor Deposition in Salt Lake City in 1972 discusses the effect of filament-wound carbon composites at angles of loading greater than or equal to 20° but less than or equal to 45°, and at a 70° angle.

SUMMARY OF THE INVENTION

The present invention uses a chemical vapor infiltration process which combines a thermal-gradient and a forced-flow approach to prepare a suitable composite tubular structure.

An object of the present invention is to provide a chemical vapor deposition apparatus and process for faster, more even and more efficient infiltration of a fibrous form with a ceramic matrix. A further object is to provide a product made by the apparatus and process, wherein a ceramic material is integrated into the fibrous structure.

Other objects and advantages of the invention are set out herein, or are obvious herefrom to one of ordinary skill in this art.

The process includes providing a fibrous preform with oppositely-located hot and cold surfaces, thereby creating a thermal gradient across the fibrous preform. A flow of a reactant gas is directed into the fibrous preform through the cold surface thereof.

The reactant gas completely infiltrates the entire fibrous preform, first preferentially reacting and depositing on the fibers in the region of the hot surface of the fibrous preform.

In a preferred embodiment the fibrous preform is a tube composed of silicon carbide (SiC) or graphite fibers.

The preform can be composed of any porous material and need not be fibrous, e.g. sponge or whiskers. One preferred reactant gas is composed of methyltrichlorosilane ($CH_3Cl_3Si$) in gaseous form and mixed with an excess molar amount of hydrogen ($H_2$). Such reactant gas is used at a temperature from 1100° to 1400° C. Alternatively, reactant gases could be used depending on the desired matrix. A desired matrix could include substances such as boron nitride or zirconium carbide. These matmrices need precursor gases such as boron tricholoride ($BCl_3$) and an excess of ammonium ($NH_3$) or borazole $B_3N_3H_6$) or zirconium tetrachloride ($ZrCl_4$) used at temperatures at or about 800° C. for the boron nitride deposit, or 1300° C.–1500° C. for the zirconium carbide deposit.

A fibrous preform to be infiltrated is held within a specially designed apparatus which provides heat to one surface of the preform, and provides water cooling to the opposite surface of the preform. In this way a thermal gradient is created across the thickness of the preform. A flow of reactant gas is directed into the fibrous form at the cold surface. The flow of gas progresses through the preform and begins to preferentially react and deposit at the hot surface of the preform. The thermal gradient across the thickness of the fibrous preform allows deposition of the ceramic matrix to occur from the hot surface toward the cold surface. This allows infiltration and deposition of the ceramic matrix without a premature clogging of the preform.

The flow of reactant gas in the uninfiltrated portion of the fibrous preform is preferably continuous throughout the deposition process. In this way a desired matrix density can be obtained within a significantly shorter time than with prior art chemical vapor deposition processes and apparatus.

The present invention can be used to prepare fiber reinforced composite materials for military applications, such as, rocket an jet engine combustion chambers, and nose cones for space and weapon vehicles. Commercial or industrial applications of the invention include heat engine and turbine components, heat exchanger tubes, and pump and valve components for high temperature erosive environment service.

The apparatus of the present invention for the chemical vapor deposition of a matrix into a preferably tubular porous preform, comprises a base for supporting one axial end of the preform, a stack connected to and extending axially from the base for extending into the tubular preform, cooling means for cooling the stack, retaining means for engaging an opposite axial end of the preform to urge the preform against the base and to define a closed inner annular chamber between the stack and an inner surface of the preform, a housing connected to the base and extending around the stack for defining an outer annular chamber with the stack wherein the preform is received, a mandrel in the inner chamber and in contact with an outer surface of the stack and an inner surface of the preform for cooling the inner surface of the preform, heating means for heating the housing to heat an outer surface of the preform, and gas supply means connected to the base for supplying a reactant gas into the inner chamber which then passes through the porous preform and into the outer chamber, the reactant gas reacting under the influence of heat to deposit the matrix in the preform starting from the heated outer surface of the preform and propagating inwardly into the inner surface of the preform.

The process for the chemical vapor deposition of a matrix into the preferred tubular porous preform configuration, according to the present invention, comprises winding ceramic fibers to form a circumferentially wound tubular preform having an inner surface, an outer surface, an axis and opposite axial ends, heating the outer surface of the preform, cooling and inner surface of the preform, sealing the opposite axial ends of the preform to form a closed inner chamber, supplying a reactant gas to the inner chamber so that the reactant gas passes through the preform, the reactant gas having the property of reacting to form a matrix when it is heated, the reactant gas reacting initially near the outer surface of the preform to form a matrix in the preform and continuing the supply of reactant gas until a desired amount of matrix is formed within the preform.

The product formed by chemical vapor deposition according to the present invention comprises a tubular porous preform made of circumferentially wound ceramic fibers which are preferably wound to lie in radial planes with respect to an axis of the preform with a matrix of ceramic surrounding the fibers in the preform.

Preliminary testing indicated that the C-ring strength of tubes fabricated from preforms with fibers at about a 10 degree angle to the radial (hoop) direction of the preform appeared greater than the strength of tubes fabricated from preforms wound in the hoop direction. A C-ring test is a compression test which causes a crack to initiate on the outside diameter and to propagate readily toward the inside diameter. In general, at some point in the crack propagation mode, the crack tip would deflect causing the crack to propagate circumferentially.

Additional advantageous features of the present invention with regard to the apparatus, are the formation of circumferentially and axially extending passages in the mandrel for conveying reactant gas from the base of the stack along the inner chamber and to the inner surface of the preform.

The preferred method of winding the fibers at an angle of approximately 10° is feeding two fiber tows at one time so there is no alignment of the crossover pattern. The resulting product is shown in FIG. 4. The preforms need not be wound, however, and if wound, need not be wound at a set angle. An equally advantageous winding pattern is shown in FIG. 6. Both preforms of FIGS. 4 and 6 show ceramic fibers wound at an angle of approximately 10° to the hoop direction.

DESCRIPTION OF THE PREFERRED EMBODIMENT

Figure 2:
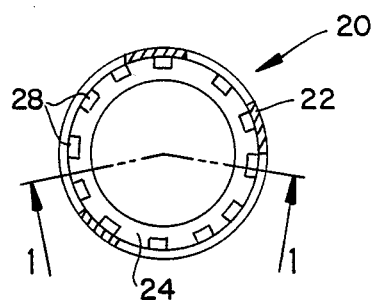
FIG. 2 is a radial sectional view of the mandrel used with the apparatus of FIG. 1.
Figure 3:
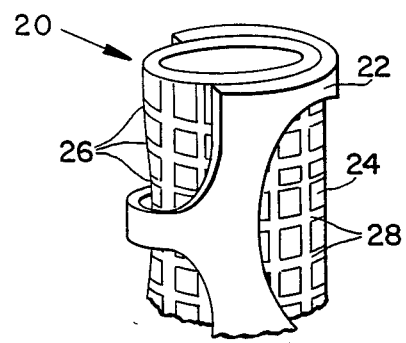
FIG. 3 is a partial perspective view of the mandrel used in the apparatus of FIG. 1.
Figure 1:
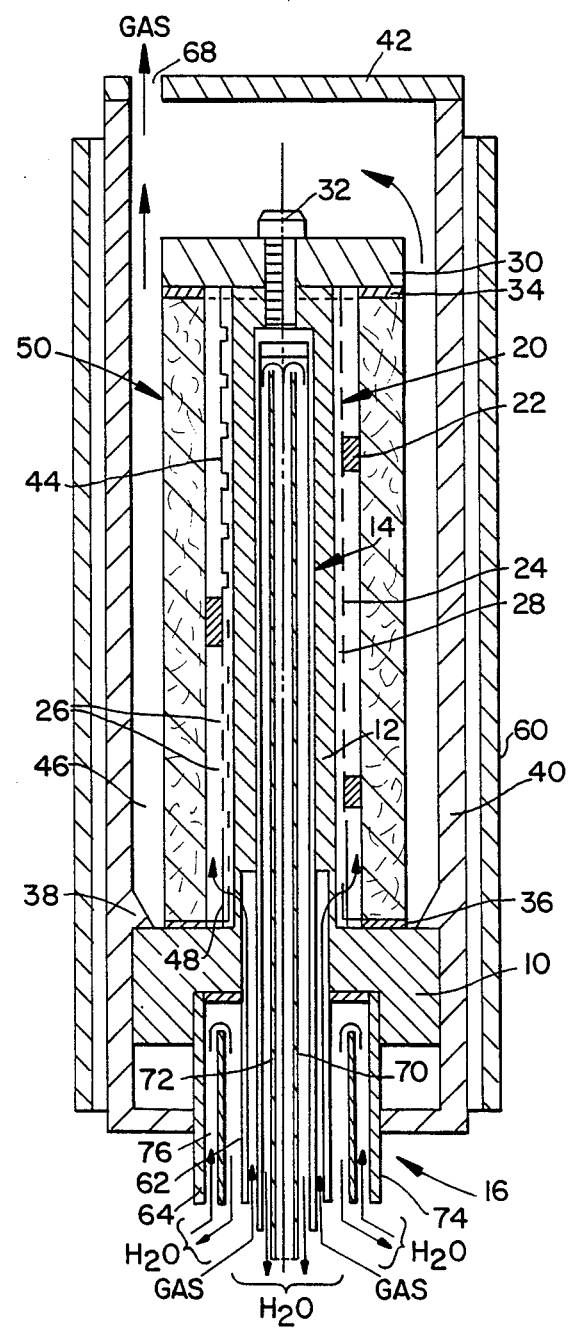
FIG. 1 is an axial sectional view of the apparatus of the present invention with a porous preform in place.

Referring to the drawings, the apparatus of the present invention is illustrated in FIGS. 1, 2 and 3. As shown in FIG. 1, the apparatus for the chemical deposition of a matrix in a porous, and preferably fibrous, tubular preform generally designated 50, comprises a base 10 which supports an axially extending stack 12, which in the embodiment shown is made as one piece with base 10. The base 10 and stack 12 preferably made of graphite.

The stack 12 is cooled internally by cooling means 14 in the form of concentric cooling tubes. The base 10 is additionally cooled by a set of cooling tubes 16.

The tubular preform 50 has a lower axial end which rests on the base 10. A gas tight gasket 36 is engaged between preform 50 and base 10.

Retaining means in the form of a graphite cap 30 is connected to the stack 12 by a bolt 32 threaded into the upper closed end of the stack. A gasket 34 is engaged between the cap 30 and the upper axial end of preform 50. In this way an inner annular chamber 44 is defined between the outer surface of the stack 12 and the inner surface of the preform 50. The chamber is closed at its lower end by base 10 and at its upper end by cap 30.

Positioned in chamber 44 and closely engaged against the outer surface of stack 12 is a mandrel generally designated 20. Mandrel 20 also shown in Figs. 2 and 3, comprises an outer perforated portrion 22 and an inner cylindrical gas distributor 24. The gas distributor 24 carries a plurality of axially spaced circumferentially extending passages 26 which cross circumferentially spaced axially extending passages 28. This forms a waffle-like grid in the mandrel 20.

The inner surface of cylindrical portion 24 is in close heat conducting contact with the outer surface of stack 12. The inner and outer portions of mandrel 20 are in close contact with each other again for the transfer of heat and the outer surface of perforated portion 22 is in close contact with inner surface of preform 50. In this way the inner surface of preform 50 is efficiently cooled by the cooling means 14, 16.

A closed outer annular chamber 46 is defined between the outer surface of preform 50 and an inner surface of a housing tube 40. Housing tube 40 carries a conical annular flange 38 which bears down on an outer top edge of base 10.

The upper end of chamber 46 is closed by cap 42 which is fixed to the top of housing 40.

An outer graphite heating tube 60 surrounds housing tube 40 and heats the housing tube to heat chamber 46 and, in turn, to heat the outer surface of preform 50. By controlling the cooling of the stack and base as well as the heating of the housing tube, a desired temperature gradient can be established across the thickness of preform 50.

Gas supply means are connected to the base for supplying reactant gas to the inner annular chamber 44. Reactant gas is first supplied to the annular space between inner and outer jacket tubes 62, 64. This annular space extends up into the base of stack 12 and communicates with a plurality of circumferentially spaced ports 48 which extend through the stack 12 and extend into communication with the passages or channels 26 and 28 of the mandrel 20. Reactant gases are thus distributed along the surface of the mandrel and uniformally along the annular chamber 44. The gas then moves radially out through the preform 50 and into the outer annular chamber 46. The gas is collected at the top of chamber 46 and exits through an opening 68 in the cap 42.

To cool the stack 12 and thus the inner surface of preform 50, water is supplied into a central tube 70 which is open at its top. Tube 70 opens into a central axial bore in stack 12 and returns through the space between a jacket tube 72 and the central tube 70. To additionally and independently cool the base 10, water is supplied into an outer jacket tube 74. The water is conveyed into the open top of an intermediate jacket tube 76 which defines an exit chamber with the outer surface of jacket tube 62.

EXAMPLE

An example of how the apparatus FIGS. 2 through 3 can be utilized is as follows:

A silicon carbide fibrous preform 50 having a length of about 5", an O.D. of 2", a wall thickness of 0.25" and a fiber content of 45% by volume, was prepared by filament winding on a winding mandrel (not shown). The preform was mounted in the apparatus of FIG. 1. The heating tube 60 was activated and heated to a temperature of 1200° C. Reactant gas consisting of hydrogen and methltrichlorosilane was supplied into the space between tubes 62 and 64 at a rate of 825 cc/min.

While the outer surface of preform 50 was maintained at the temperature 1200° C., cooling was applied to the inner surface by passing water through the cooling means 14, 16. A temperature gradient was maintained across the wall thickness of preform 50.

After a period of forty-five hours, the process was completed as indicated by a reduced flow of reactant gas through the preform. The resultant SiC infiltrated tube had a density of 2.60 g/cc which is equivalent to approximately 90% of theoretical density.

Figures 4, 5:
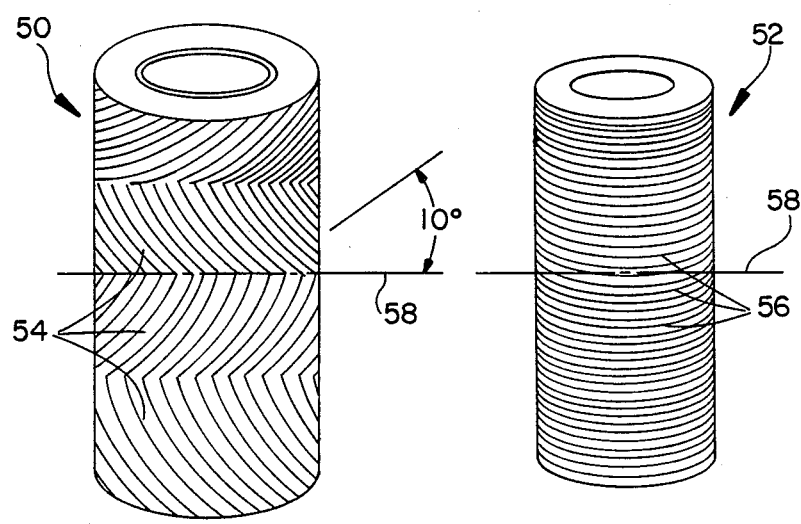
FIG. 4 is a perspective view of a product formed in accordance with the present invention having wound tows of fiber which extend at about 10° to a radial planes of the product.
FIG. 5 is a view similar to FIG. 4, showing another embodiment of the invention wherein the fibers are wound in the hoop direction, parallel to radial planes of the product.
Figure 6:
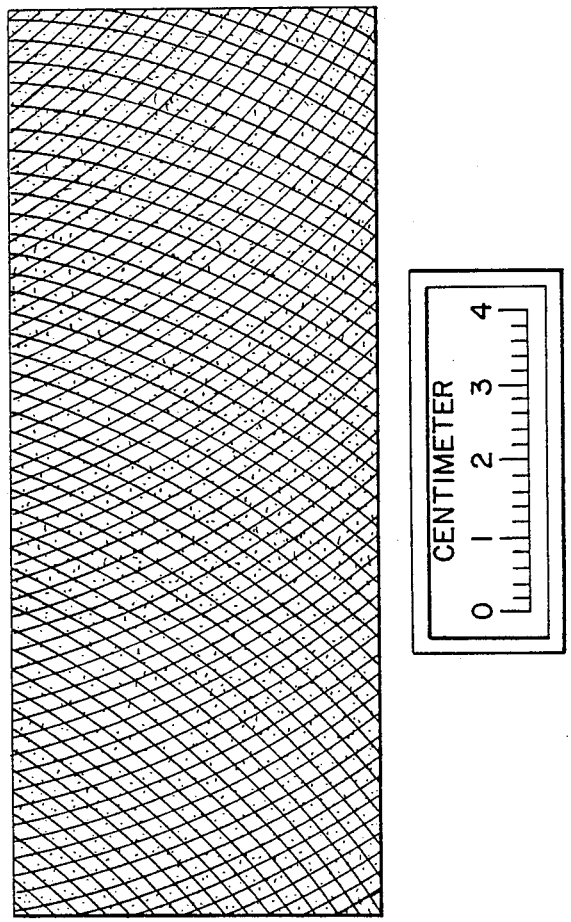
FIG. 6 is a perspective view of a product formed in accordance with the present invention having an alternative winding pattern with tows of fiber extending at about 10° to radial planes of the product.

One example of the preform used with the invention had 500 fibers/tow with each fiber being approximately 12 microns in diameter. Initial advantageous results were achieved by winding the silicon carbide tows 10° off the hoop or radial direction as shown in FIG. 4. The tubular preforms were carefully wound to avoid large size pores in the preform which greatly enhanced the even distribution of matrix within the preform.

FIG. 5 shows another example of the invention wherein the tows 56 of the wound tube 52 were wound in the hoop direction (lying in radial plane 58).

Several later runs of the invention used fibers in the preform which were precoated with a thin layer of pyrolytic carbon. This was thought to weaken and make uniform the bond between the fibers and the matrix to enhance the desired fiber pullout and promote nonbrittle fracture of the product, as compared to the brittle fracture normally associated with non-reinforced ceramics. Although a desired thickness for the pyrolytic carbon was 0.1 to 0.2 micrometers, the thickness actually obtained was 0.3 to 0.5 micrometers.

Nineteen examples of the inventive product were formed using the apparatus and process of the present invention.

An advantageous range for the density of the tubes in applications requiring high density and high strength was from 65% to 90% of theoretical with a preferred range being 75% to 90% of theoretical. The optimum strengths obtained were 807 MPa at room temperature, 490 MPa at 1000° C. and 172MPa at 1200° C. In general the specimens exhibited good composite behavior during fracture testing. Different applications could, of course, require other ranges.

While a specific embodiment of the invention has been shown and described in detail to illustrate the application of the principles of the invention, certain modifications and improvements will occur to those skilled in the art upon reading the foregoing. For example, the process taught herein is not limited to tubular preforms but could be used for cones, polygons, and plates. Further, the process is not limited to cooling the preform and feeding the reactant vapors from the inside diameter, but can be modified to cool the preform and to feed the reactant vapors from the outside of the preform or, in the case of a plate, from one chosen side. It should be understood that these and other modifications and improvements have been deleted herein for the sake of conciseness and readability, but are properly within the scope of the following claims.

We claim:

1. An apparatus for the chemical vapor deposition of a matrix into a tubular porous preform, comprising:
   a base adapted for supporting one axial end of the preform;
   a stack connected to and extending axially from said base and adapted for extending into the preform, said stack having an outer surface, said stack having ports adjacent said base;
   cooling means in said stack for cooling said stack;
   retaining means connected to said stack and adapted to engage an opposite axial end of the preform, for retaining the preform against the base and for defining an inner annular chamber between the preform and said stack;

a housing connected to said base and extending axially from said base and around said stack to define an outer annular chamber with said stack which is adapted for receiving the preform;

a mandrel in said inner chamber and in contact with said outer surface of said stack to be cooled by said cooling means of said stack, said mandrel having an outer perforated portion adapted for contact with an inner surface of the preform for cooling the inner surface of the preform and an inner cylindrical portion in contact with the outer surface of said stack and in contact with said outer perforated portion, said inner portion of said mandrel having circumferentially spaced passages;

heating means for heating said housing to heat an outer surface of the preform; and a gas supply means connected to said base, said ports of said stack and said circumferentially spaced passages of said mandrel communicating with said gas supply means for supplying a reactant gas into said inner chamber, which reactant gas reacts to form a matrix upon being heated, the reactant gas passing through the preform and moving through said outer chamber, the reactant gas depositing matrix initially at the outer heated surface of the preform, the matrix being deposited progressively inwardly of the preform.

2. An apparatus according to claim 1 wherein said cooling means includes a pair of concentric cooling jacket tubes in said stack extending from said base almost to a top of said stack, said stack having a closed top.

3. An apparatus according to claim 3 including additional cooling jacket tubes in said base for independently cooling said base.

4. An apparatus according to claim 1 wherein said retaining means comprises a cap on said stack and a connector for fixing said cap to said stack.

5. An apparatus according to claim 5 including a first gasket on said base for engagement with the lower axial end of the preform, and a second gasket under said cap for engagement with the opposite axial end of the preform, said gaskets serving to seal said inner annual chamber.

* * * * *